United States Patent
Denzler et al.

(10) Patent No.: US 6,612,558 B1
(45) Date of Patent: Sep. 2, 2003

(54) APPARATUS FOR FIXING SUBSTRATES

(75) Inventors: Ludwig Denzler, Keltern (DE); Ulrich Speer, Eisingen (DE); Klaus Weber, Bretten (DE)

(73) Assignee: STEAG HamaTech AG (DE)

( * ) Notice: Subject to any disclaimer, the term of this patent is extended or adjusted under 35 U.S.C. 154(b) by 0 days.

(21) Appl. No.: 09/674,140

(22) PCT Filed: Apr. 14, 1999

(86) PCT No.: PCT/EP99/02500
§ 371 (c)(1),
(2), (4) Date: Dec. 15, 2000

(87) PCT Pub. No.: WO99/56306
PCT Pub. Date: Nov. 4, 1999

(30) Foreign Application Priority Data

Apr. 24, 1998 (DE) .......................................... 198 18 478

(51) Int. Cl.⁷ ................................................ B23Q 3/14
(52) U.S. Cl. .................. 269/48.1; 269/254 CS
(58) Field of Search ................. 269/48.1, 53, 54.1, 269/54.5, 47, 63, 68, 900, 903, 254 CS; 451/364; 29/559

(56) References Cited

U.S. PATENT DOCUMENTS

| | | | |
|---|---|---|---|
| 3,139,785 A | * 7/1964 | Harwood | 269/48.1 |
| 4,935,695 A | * 6/1990 | Hayes et al. | 269/48.1 |
| 5,000,651 A | 3/1991 | Akagawa et al. | |
| 5,080,736 A | 1/1992 | Matsui | |
| 5,566,840 A | * 10/1996 | Waldener et al. | 269/903 |
| 5,698,030 A | 12/1997 | Rubenchik | |
| 6,161,826 A | * 12/2000 | Forrer | 269/309 |
| 6,241,228 B1 | * 6/2001 | Chupick | 269/48.1 |

FOREIGN PATENT DOCUMENTS

| | | |
|---|---|---|
| DE | 195 29 537 A1 | 8/1995 |
| DE | 196 18 278 A1 | 11/1997 |
| DE | 196 44 158 A1 | 4/1998 |
| DE | 197 18 471 A1 | 11/1998 |
| DE | 197 21 689 A1 | 11/1998 |
| EP | 0 790 331 A1 | 8/1997 |
| JP | 55125587 | 9/1980 |
| JP | 60239961 | 5/1984 |
| JP | 60239961 | 11/1985 |

OTHER PUBLICATIONS

Article: o+p–ölhydraulik und pneumatik—22(1978) Nr 1, p. 10.

* cited by examiner

Primary Examiner—Lee D. Wilson
(74) Attorney, Agent, or Firm—R W Becker & Associates; R W Becker

(57) ABSTRACT

An apparatus for fixing and centering substrates that are each provided with an inner hole is provided. The apparatus has a housing having an axis that extends perpendicular to the plane of a substrate placed on the apparatus. A fixation unit is guided in the housing and is introducible into the inner hole of a substrate. The fixation unit includes an outer element that is moveable along the axis of the housing and relative to the housing, and also includes an inner element that is moveable along the axis of the housing and relative to the housing and to the outer element, which, by way of a relative movement of the inner and outer elements, is expandable for engagement with the inner hole of a substrate.

20 Claims, 3 Drawing Sheets

APPARATUS FOR FIXING SUBSTRATES

BACKGROUND OF INVENTION

The present invention relates to an apparatus for fixing in position substrates that each have an inner hole, and includes a housing and an element disposed in the housing and introducible into the inner hole.

Such an apparatus can be used, for example, at various stations of an apparatus for the adhesive joining of substrates, as is described, for example, in DE-A-197 18 471, which is not prepublished and which belongs to the Applicant of the present application. In particular, the inventive apparatus is suitable for use with an apparatus for drying substrates, as described in the not prepublished DE-197 21 689, which belongs to the Applicant of the present application. To avoid repetition, the content of the aforementioned applications are incorporated for their content into this application. With the above apparatus, substrates are respectively deposited on a support for specific treatment steps in order, for example, to carry out an adhesive joining of two substrates or a drying of substrates. In this connection, the support surfaces provide no fixing of the substrates that are to be treated and positioned, so that the substrates can slide, especially two substrates that are to be adhesively joined can slide. This in turn affects the treatment process, which can lead to deterioration in the quality of substrates being treated.

SUMMARY OF INVENTION

DE-A-196 44 158 discloses an apparatus for grasping objects having a through opening. The apparatus has a gripper 12 that comprises a base body 4, a push member 9 that is axially moveable in the base body 4, and balls 6 that are disposed in the base body 4 and that, by means of an axial movement of the push member within the main body, can be shifted outwardly beyond the outer periphery of the main body 4.

DE-A-196 18 278 discloses a clamping device for drawing in and clamping a tool holder having a hollow cone shaft in the tool receiving means of a main spindle. With this device, clamping jaws for the securement of the tool holder are spread apart by means of a clamping mechanism that is displaceable relative to the clamping jaws.

From the publication "o+p-ölhydraulik und pneumatik-22 (1978) Nr. 1, page 10, there is known an inner hole gripper that fixes a substrate in position by means of a pneumatic expansion of an element that is introduced into an inner hole of the substrate.

DE-A-195 29 537 furthermore discloses an apparatus pursuant to the introductory portion of claim 1.

It is therefore an object of the present invention to provide an apparatus of the aforementioned type for fixing in position substrates that are each provided with an inner hole, whereby the apparatus, with straightforward technical means and simple handling of the apparatus, enables a good fixing of the substrates in position in order to enable lower rejection rates and a better quality of the finished substrates.

SUMMARY OF THE INVENTION

The stated object is inventively realized in that the element that is introducible into the inner hole includes an outer element that is axially moveable relative to the housing, and an inner element that is axially moveable relative to the housing, whereby the outer element can be expanded or spread apart by means of a relative movement of the elements. Due to the expansion of the outer element in the inner hole of a substrate, the substrate is on the one hand fixed in position and is centered relative to the outer element. In particular, with substrates that are to be adhesively interconnected and are yet to be dried, there also results in this connection a good centering of the two substrates relative to one another. Due to the fact that not only the inner element, but also the outer element, are axially moveable relative to the housing, there results a simple possibility for introducing and removing these elements into and out of an inner hole of a substrate.

The outer and/or inner element is advantageously cylindrical in order to achieve a straightforward configuration and to be able to reliably come into engagement with the inner hole of the substrate or substrates.

In order to provide the expandability of the outer element in a simple manner, slots are provided in an end region of the outer element. The outer element is advantageously elastically expandable, i.e. after the expansion the outer element elastically returns to the non-expanded state and thus releases the engagement with the substrate or substrates.

Pursuant to one specific embodiment of the invention, the outer element is provided in the region of the slots with a tapering inner diameter by means of which the ability to expand is achieved during a relative movement of the elements.

The outer element can advantageously be axially biased by means of a biasing device so that it is biased in a particular axial position in which the outer element is disposed in an inner hole of a substrate. A particularly suitable biasing device is a spring.

Pursuant to one preferred specific embodiment, the inner element has an inclined surface on the outer periphery that is advantageously complementary to the tapering inner diameter of the outer element in order to expand the outer element in a manner that is as free from resistance as possible during a relative movement of the elements.

By means of a biasing device, the inner element can advantageously be axially biased into a position that expands the outer element in order to bring the inner element in a simple manner into a position in which the inner element expands the outer element. For this purpose, the biasing device is advantageously a spring.

To ensure that at a pressure that is exerted upon the apparatus from the outside prior to a movement of the outer element initially the expansion of the outer element is terminated, the biasing device for the inner element has a smaller spring constant than does the biasing device for the outer element.

The outer element preferably has a support surface for the biasing device for the outer and inner elements.

Pursuant to a further specific embodiment of the invention, the outer and inner elements can be axially biased by a common biasing device, which is advantageously a spring. By utilizing a common biasing device, the number of components that form the apparatus can be reduced.

In order to limit the relative movement of the elements relative to one another, and to prevent the elements from coming apart, the outer element, in a non-expandable end region, is provided with a shoulder in the inner periphery.

The inner element advantageously has a projection that can extend out of the outer element in order in a simple manner, by pressure upon the projection, to enable a relative movement between the elements.

Pursuant to a further preferred specific embodiment of the invention, the housing that receives the moveable outer and inner elements is stationary in order to form a fixed receiving device.

In order to provide a better hold for the fixed substrate or substrates, the housing advantageously has a substrate support surface.

At one end the housing advantageously has a base wall in order to form a counter surface for the biasing device that biases the outer and/or inner element.

The specification incorporates by reference the disclosure of German priority document 198 18 478.6 of Apr. 24, 1998 and International priority document PCT/DE99/02500 of Apr. 24, 1999.

The present invention is, of course, in no way restricted to the specific disclosure of the specification and drawings, but also encompasses any modifications within the scope of the appended claims.

BRIEF DESCRIPTION OF DRAWINGS

The invention will subsequently be explained with the aid of preferred embodiments with reference to the figures, in which.

DESCRIPTION OF PREFERRED EMBODIMENTS

Figure 1:
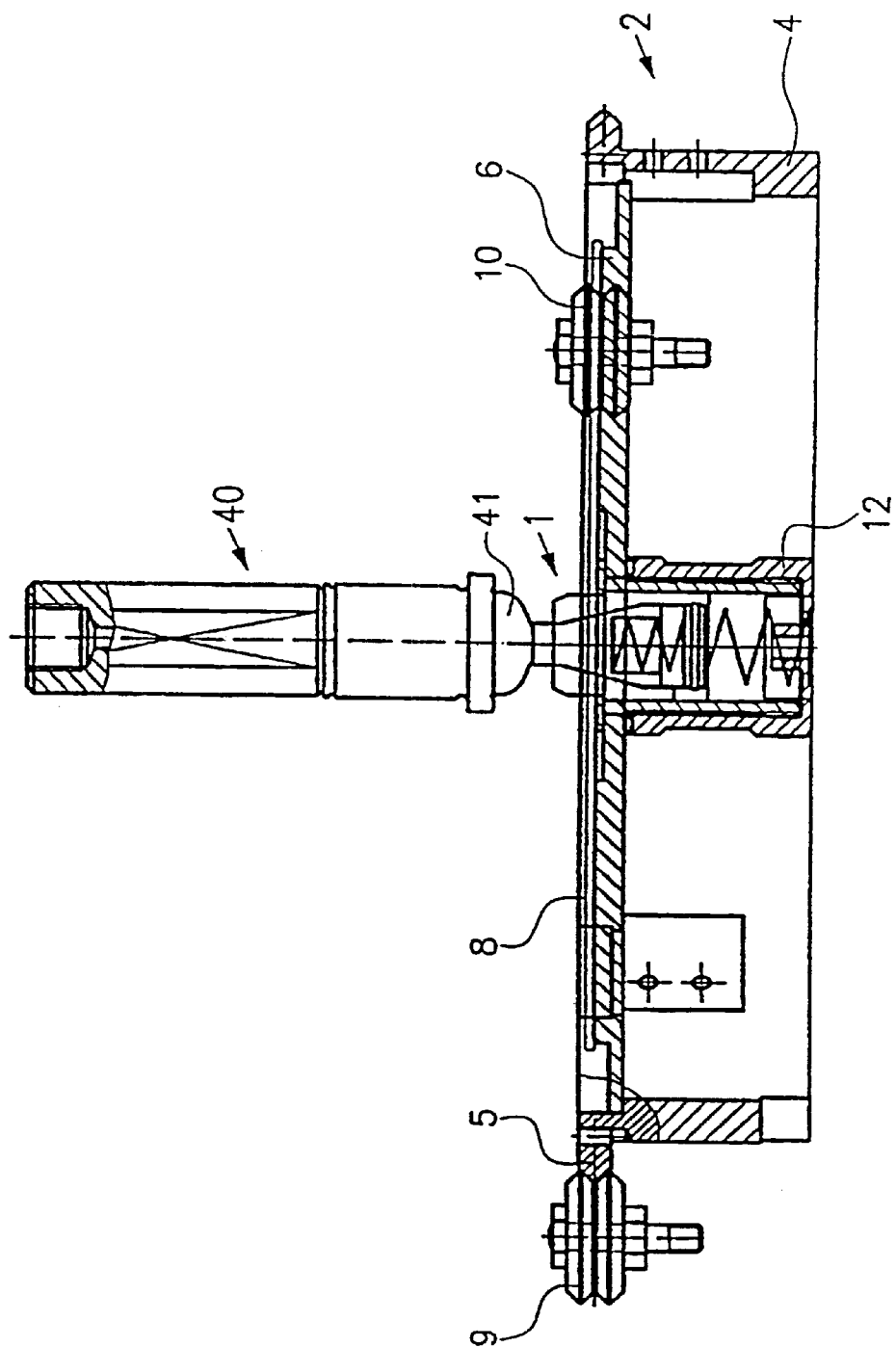
FIG. 1 shows a schematic illustration of one inventive fixation apparatus in an expanded or spread-apart state, as it is used in a drying apparatus.

FIG. 1 is a schematic illustration of an inventive fixation apparatus 1 as it is utilized in a—at least partially illustrated—drawing apparatus 2 for semiconductor substrates. The drawing apparatus 2 illustrated in FIG. 1 can be of the type disclosed in the not prepublished DE 197 721 689, which belongs to the Applicant of the present application. To avoid repetition, the content of that application is incorporated relative to the subject matter of the present application.

The drying apparatus has a lower portion 4 and a non-illustrated upper portion. The lower portion 4 is provided with a supporting plate 5 having a glass support panel 6 upon which a substrate disk 8 is disposed. The supporting plate 5 is rotatable, and is simultaneously guided in its position, by rollers 9 and 10. Although only two rollers 9, 10 are illustrated in FIG. 1, the drawing apparatus generally has three rollers that are respectively angularly offset by 120° relative to one another.

The lower portion 4 is furthermore provided with a central guide element 12 for receiving the inventive fixation apparatus 1.

Figure 2:
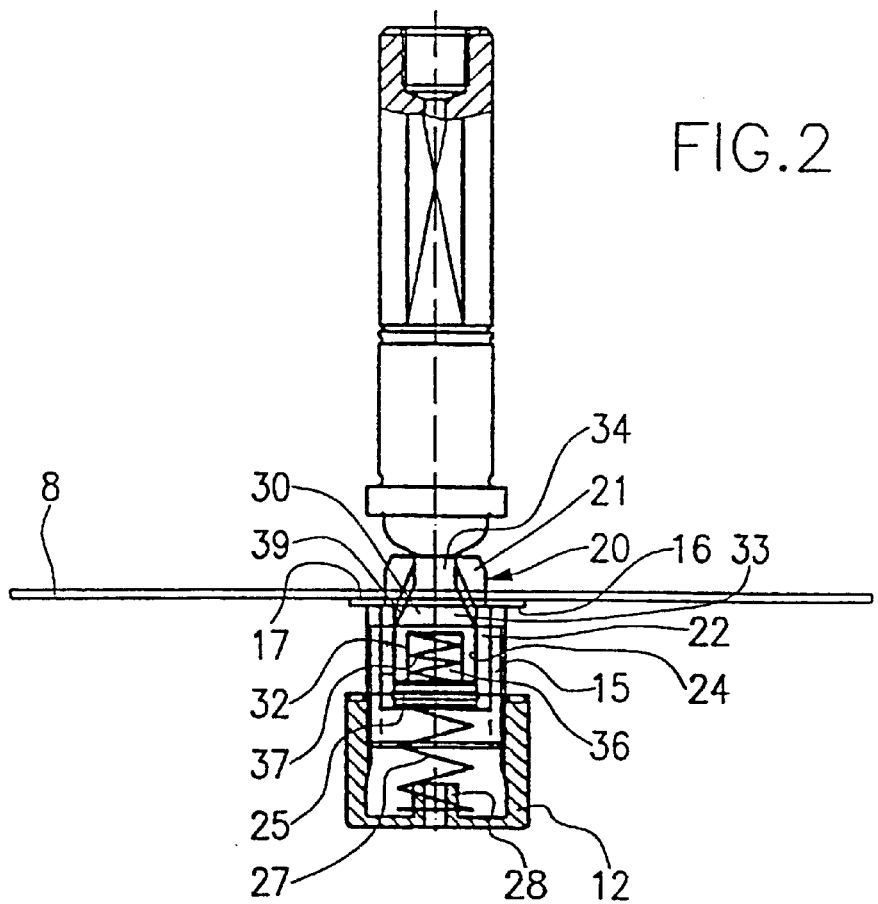
FIG. 2 shows the inventive fixation apparatus of FIG. 1 in a non-expanded state, whereby for the sake of simplification parts of the drying apparatus have been omitted.

As can be best seen in FIG. 2, the fixation apparatus 1 is provided with a stationary housing 15 that is accommodated in the guide element 12. The housing 15 has a hollow cylindrical shape with an annular flange 16 at an upper end of the housing. The annular flange 16 projects beyond the outer periphery of the cylindrical housing 15 and forms a substrate support surface 17 on the upper surface.

Figure 4:
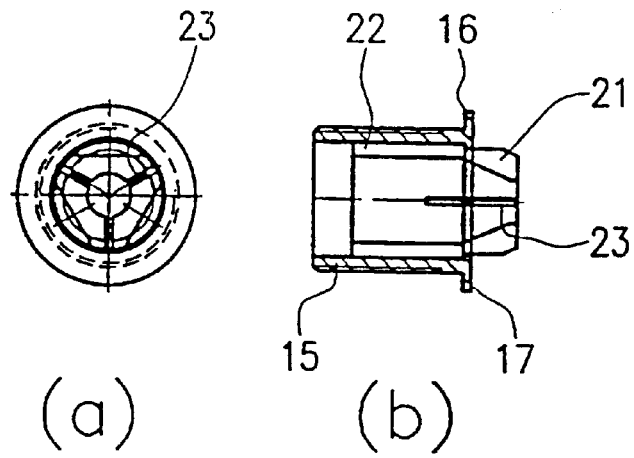
FIGS. 4a and b are a schematic plan view of the inventive apparatus or a schematic sectional view of a housing and an outer element of the inventive fixation apparatus.

Concentrically disposed within the cylindrical housing 15 is a moveably accommodated outer element 20 having an upper end portion 21 that can expand or spread, and a part 22 that cannot expand. The outer element 20 is again hollow cylindrical, and has an inner periphery 24 that tapers upwardly in the direction of the spreadable portion 21. As can be best seen in FIG. 4, three slots 23 are provided in the region of the spreadable end portion 21.

The lower end of the non-expandable part 22 is closed off by means of a plug 25 that can be screwed in.

The outer element 20 is biased upwardly by means of a spring 27, which on the one hand is supported against the plug 25 and on the other hand is supported against the guide element 12. The guide element 12 is provided with a centered guide projection 28 that extends into the spring 27, which is embodied as a compression spring. In this way, a lateral sliding and tilting of the spring 27 is prevented.

Concentrically accommodated in the outer element 20 is an inner element 30 that is displaceable relative to the outer element. The inner element 30 has a hollow cylindrical end portion 32, a conically tapering central portion 33, and an end portion 34 that forms a projection.

The hollow cylindrical end portion 32 has a hollow receiving chamber 36 in which is accommodated a spring 37. One end of the spring 37, which is embodied as a compression spring, is supported against the plug 25, and the other end of the spring is supported against an inner wall of the inner element in order to bias it upwardly.

The conically tapering central portion 33 is provided with an inclined outer peripheral surface 39 that is complimentary to the conically tapering inner circumferential surface of the expandable end portion 21 of the outer element 20.

The cylindrical end portion 34 forms a projection that can extend through the expandable end portion 21, as illustrated in FIG. 1.

Figure 3:
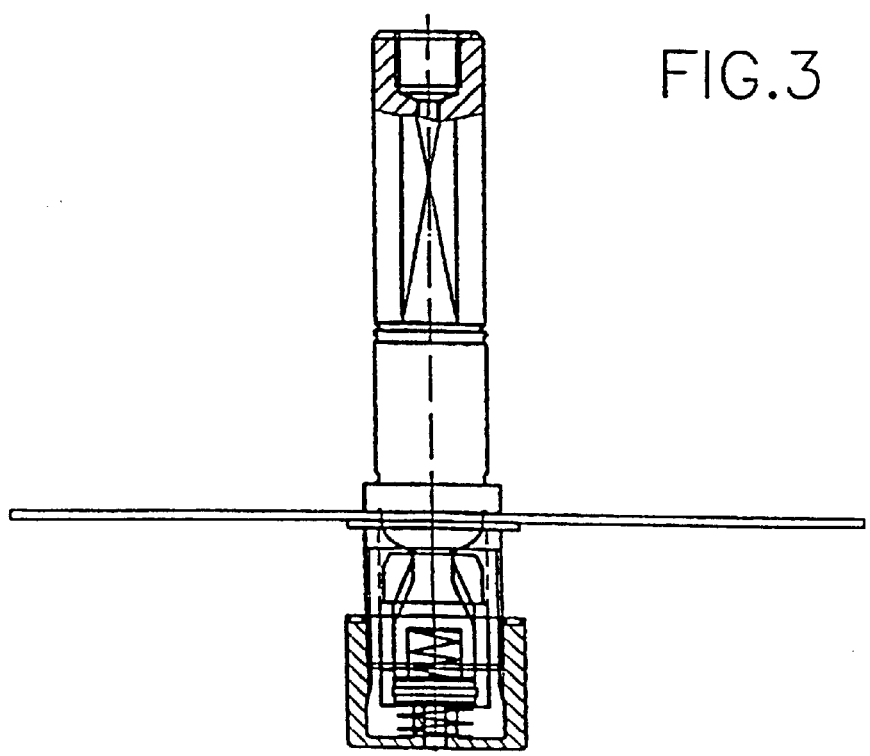
FIG. 3 is a schematic illustration of the inventive fixation apparatus of FIG. 1 in a non-expanded and retracted position, whereby again parts of the drawing apparatus have been omitted.

In FIGS. 1 to 3, a so-called inner hole gripper 40 is illustrated above the inventive fixation apparatus 1.

This inner hole gripper 40 is axially moveable by a non-illustrated mechanism. The inner hole gripper 40 is furthermore provided with a spherically shaped end portion 41 that can be introduced into an inner hole of a substrate 8 and can be spread apart within the inner hole in order to grasp the substrate 8 and possibly transport it. Inner hole grippers of this type are known, and the inner hole gripper will therefore not be further described.

The operation of the inventive fixation apparatus 1 will now be explained with the aid of FIGS. 1 to 3. As can be seen in FIG. 1, the outer element is biased upwardly via the spring 27 within the stationary housing 15. In so doing, the outer element 20 extends through an inner hole of a substrate 8. Furthermore, the inner element 30 is biased upwardly by the spring 37 within the outer element 20. In so doing, the inclined surface 39 comes into contact with the tapered inner periphery 24 of the expandable end portion 21 and spreads the expandable end portion 21 apart. As a result, the outer periphery of the expandable end portion 21 comes securely into engagement with the inner hole of the wafer 8. The wafer is consequently centered and fixed relative to the fixation apparatus 1. In the position illustrated in FIG. 1, the cylindrical end portion 34 extends axially out of the expandable end portion 21 of the outer element 20.

In order to release the fixation of the wafer 8, the spherical head 41 of the inner hole gripper is brought into contact with an upper surface of the cylindrical end portion 34 of the inner element 30, as can be seen in FIG. 1. The inner element 21 is then pressed downwardly by the inner hole gripper 40 into the outer element, and in particular against the tension of the spring 37. Due to the fact that the spring constant of the spring 37 is less than the spring constant of the spring 27, which biases the outer element upwardly, the outer element 20 initially maintains its position. When the inner element 30 is disposed in the position illustrated in FIG. 2, the inclined surface 39 is no longer in contact with the tapering portion of the inner periphery 24 of the outer element, and the expandable end portion 21 elastically returns to its non-spread apart position. Consequently, the contact with the inner hole of the wafer 8 is released, which is thus no longer fixed.

After releasing the fixation, the inner hole gripper 40 is now moved further downwardly, as a result of which the outer element 20 is now also pressed downwardly against the force of the spring 27 out of the inner hole of the wafer 8. This position is illustrated in FIG. 3. In this position, the spherical head 41 of the inner hole gripper 40 can be spread apart in order to come into engagement with the inner hole and to grasp the wafer 8. If the inner hole gripper is now moved upwardly, it takes the wafer 8 along with it. In so doing, the outer element 20 and the inner element 30 return in a reversed manner into the position shown in FIG. 1, whereby this time the outer element merely does not extend through an inner hole of the wafer 8.

The fixation of a wafer with the fixation apparatus 1 is effected in the reverse order.

Figure 5:
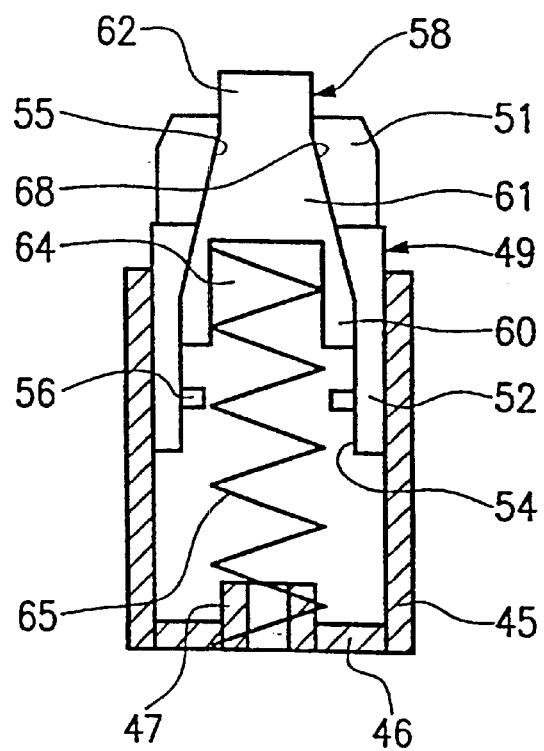
FIG. 5 is an enlarged schematic illustration of a further embodiment of the inventive fixation apparatus.

FIG. 5 shows a further specific embodiment of the inventive fixation apparatus. The inventive fixation apparatus pursuant to the second embodiment has a hollow cylindrical housing 45. An end portion of the hollow cylinder is provided with a radially extending wall 46 that closes off the hollow cylinder. The wall 46 is provided with a centered central projection 47.

Disposed in the housing 45 is an outer element 49 that is axially displaceable within the housing and that has an expandable end portion 51 and a non-expandable part 52. The outer element 49 is hollow cylindrical and has an inner periphery 54 that tapers in the upper region and forms an inclined surface 55. Disposed in the region of the non-expandable part 52, on the inner periphery 54, is an annular element 56 that is connected to the inner periphery 54 in any suitable manner, for example via a screw connection.

Concentrically disposed within the outer element 49 is an inner element 58 that is essentially the same as the inner element 30 of the first embodiment. The inner element is again provided with an essentially hollow cylindrical end portion 60, a conically tapering central portion 61, as well as a cylindrical end portion 62. The hollow cylindrical portion 60 defines a receiving chamber 64 for a spring 65, which axially upwardly biases the inner element 58. The spring 65 extends into the receiving chamber 64, is supported against a wall thereof, and extends from there through the annular element 56 to the radially extending end wall 46 of the housing 45. The guide projection 47 of the end wall 46 extends into the spring 65, which is embodied as a compression spring, and guides the same.

The radially tapering central portion 61 is again provided with an inclined surface 68 that is complementary to the inclined surface 55, and in the position shown in FIG. 5 comes into engagement therewith in order to spread the expandable end portion 51 of the outer element 49 apart. The cylindrical portion 62 extends axially outwardly out of the outer element 49.

The manner of operation of the fixation apparatus pursuant to the second embodiment is essentially the same as the operation of the apparatus pursuant to the first embodiment.

The essential difference is that only one spring 65 is provided that serves to axially upwardly bias not only the inner element 58 but also the outer element 49. This occurs in that the spring first axially upwardly biases the inner element 58 and via the inner element 58 indirectly axially upwardly biases the outer element 49. If via an inner hole gripper the inner element 58 is pressed from above, the inner element moves downwardly relative to the outer element 49, and in particular against the tension of the spring 65. In so doing, in the same manner as described in conjunction with the first embodiment, the expansion of the expandable part 51 of the outer element is released. After a further, downwardly directed movement of the inner hole gripper, the inner element 58 comes into engagement with the annular element 56. After a further, downwardly directed movement of the inner hole gripper, the outer element is now also pressed downwardly.

The inventive fixation apparatus was described with the aid of specific embodiments, in particular in conjunction with a drying apparatus 2 for semiconductor substrates. However, embodiments and modifications will be possible for one skilled in the art without thereby departing from the inventive concept. For example, the fixation apparatus can also be used with other apparatus where a substrate having an inner hole must be fixed in position.

What is claimed is:

1. An apparatus for fixing and centering substrates that are each provided with an inner hole, said apparatus comprising:
a housing having an axis that extends perpendicular to a plane of a substrate placed on said apparatus; and
a fixation means that is guided in said housing and is introducible into an inner hole of a substrate, wherein said fixation means includes an outer element that is moveable along said axis of said housing and relative to said housing, and also includes an inner element that is moveable along said axis of said housing and relative to said housing and to said outer element, and wherein said outer element, by means of a relative movement of said inner and outer elements, is expandable for engagement with an inner hole of a substrate.

2. An apparatus according to claim 1, which further comprises a guide element that is guided in said housing, wherein said fixation means is guided in said guide element.

3. An apparatus according to claim 2, wherein said guide element is provided with a substrate support surface.

4. An apparatus according to claim 1, wherein at least one of said outer and inner elements is cylindrical.

5. An apparatus according to claim 1, wherein an end portion of said outer element is provided with slots.

6. An apparatus according to claim 5, wherein said outer element is elastically expandable.

7. An apparatus according to claim 5, wherein said outer element, in the vicinity of said slots, is provided with a tapering inner diameter.

8. An apparatus according to claim 7, wherein said inner element is provided with an inclined outer peripheral surface.

9. An apparatus according to claim 8, wherein said inclined outer peripheral surface of said inner element is complementary to said tapered inner diameter of said outer element.

10. An apparatus according to claim 1, which includes a first biasing device for axially biasing said outer element.

11. An apparatus according to claim 10, which includes a second biasing device for axially biasing said inner element into a position that expands said outer element.

12. An apparatus according to claim 11, wherein said first biasing device is a first spring, and said second biasing device is a second spring.

13. An apparatus according to claim 11, wherein said second biasing device for said inner element has a smaller spring constant than does said first biasing device for said outer element.

14. An apparatus according to claim 1, wherein said outer element is provided with a support element for biasing means for said outer and inner elements.

15. An apparatus according to claim 1, which includes a common biasing device for axially biasing said outer and inner elements.

16. An apparatus according to claim 1, wherein said outer element, in a non-expandable region thereof, is provided on an inner periphery with an annular element.

17. An apparatus according to claim 1, wherein said inner element is provided with a projection that is adapted to extend out of said outer element.

18. An apparatus according to claim 1, wherein said housing is stationary.

19. An apparatus according to claim 1, wherein said housing is provided with a base wall.

20. An apparatus according to claim 19, wherein said base wall is provided with a guiding projection.

* * * * *